(12) United States Patent
Petsch

(10) Patent No.: US 9,933,253 B2
(45) Date of Patent: Apr. 3, 2018

(54) METHOD FOR POSITIONING A LIGHT-SHAPING BODY

(71) Applicant: ZIZALA LICHTSYSTEME GMBH, Wieselburg (AT)

(72) Inventor: Daniel Petsch, Gaming (AT)

(73) Assignee: ZKW GROUP GMBH, Wieselburg an der Erlauf (AT)

( * ) Notice: Subject to any disclaimer, the term of this patent is extended or adjusted under 35 U.S.C. 154(b) by 405 days.

(21) Appl. No.: 14/419,852

(22) PCT Filed: Jul. 22, 2013

(86) PCT No.: PCT/AT2013/050138
§ 371 (c)(1),
(2) Date: Feb. 5, 2015

(87) PCT Pub. No.: WO2014/028954
PCT Pub. Date: Feb. 27, 2014

(65) Prior Publication Data
US 2015/0211843 A1    Jul. 30, 2015

(30) Foreign Application Priority Data
Aug. 23, 2012 (AT) .............................. A 50336/2012

(51) Int. Cl.
*G01B 11/27* (2006.01)
*F21S 41/19* (2018.01)
(Continued)

(52) U.S. Cl.
CPC ............ *G01B 11/27* (2013.01); *F21S 41/147* (2018.01); *F21S 41/19* (2018.01); *F21S 41/192* (2018.01); *F21S 41/39* (2018.01); *F21S 48/1104* (2013.01); *F21S 48/1305* (2013.01); *H05K 3/34* (2013.01); *F21S 45/47* (2018.01); *F21S 48/328* (2013.01); *F21W 2101/10* (2013.01); *F21W 2102/00* (2018.01); *F21Y 2115/10* (2016.08); *Y10T 29/4978* (2015.01); *Y10T 29/49133* (2015.01)

(58) Field of Classification Search
CPC ..... G02B 6/422–6/4227; G02B 6/4242; G02B 6/4244; F21S 48/10–48/1794; F21S 41/192; F21S 41/19; F21S 41/39; F21S 41/147; G01B 11/27
See application file for complete search history.

(56) References Cited

U.S. PATENT DOCUMENTS

2007/0058904 A1* 3/2007 Ban ...................... G02B 6/4204
385/52

* cited by examiner

*Primary Examiner* — Livius R Cazan
(74) *Attorney, Agent, or Firm* — Eversheds Sutherland (US) LLP

(57) ABSTRACT

The invention relates to a method for positioning a light-shaping member, for example a reflector (1), relative to at least one light source (2), comprising the following steps:
a) fitting the at least one light source (2) on a carrier plate (3);
b) measuring the position of the at least one light source (2) on the carrier plate (3);
c) fitting one or preferably more reference positions (4) on the carrier plate (3), wherein the position of the at least one reference position (4) is dependent on the position of the at least one light source (2);
d) referencing, i.e. aligning, the light-shaping member to/with the reference position(s) (4) on the carrier plate (3); and
e) securing the light-shaping member on the carrier plate (3) or in relation to the carrier plate (3).

8 Claims, 3 Drawing Sheets

Figure 1:
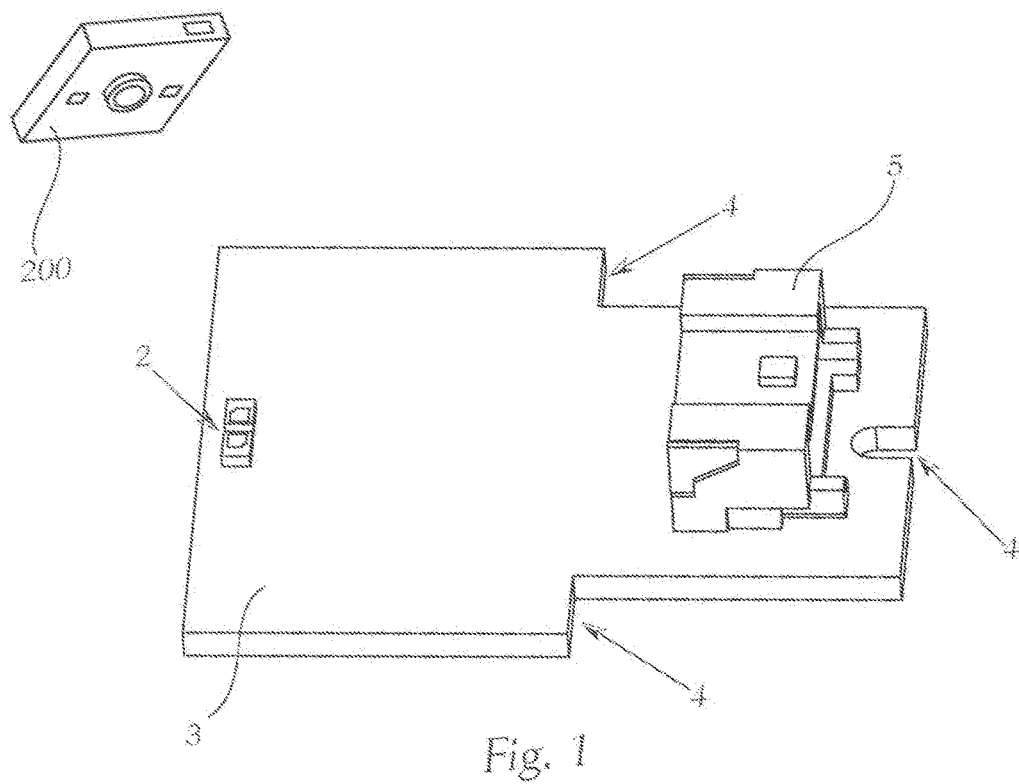

(51) Int. Cl.
*F21S 41/39* (2018.01)
*F21S 41/147* (2018.01)
*H05K 3/34* (2006.01)
*F21S 8/10* (2006.01)
*F21W 101/10* (2006.01)
*F21Y 115/10* (2016.01)

METHOD FOR POSITIONING A LIGHT-SHAPING BODY

The invention relates to a method for positioning a light-shaping member, for example a reflector, relative to at least one light source.

In order to produce a desired light distribution in the region in front of and/or behind a vehicle, a light module for a vehicle headlight or a vehicle headlight itself has one or more light sources as well as one or more light-shaping members, for example one or more reflectors. Light exiting from the light source is emitted from such a reflector as desired light exposure into a region in front of the vehicle in which the vehicle headlight is installed.

In order to be able to produce an optimal and in particular legally compliant light exposure, the exact positioning of the light source in relation to the reflector is of particular importance. By way of example, in the case of the use of LED light sources which have one or more light-emitting diodes as light-emitting elements, the deviations from the target position must lie merely in the region of $1/10$ of a millimeter, i.e. the reflector and LED light source(s) must be positioned in an extremely exact manner relative to one another.

In the case of current mounting concepts, the LED light source is firstly soldered onto an LED print (printed circuit board) and this print is then secured to a heat sink, for example bonded thereto or screwed thereto. The reflector is then mounted on the heat sink.

In the case of this mounting concept, the following tolerances occur: tolerance in the position of the light-emitting diodes in relation to the LED housing, LED housing in relation to the LED print, LED print in relation to reference positions on the heat sink, heat sink tolerances per se, heat sink/reflector tolerance, and reflector tolerances.

Accordingly, with a mounting concept of this type, an optimal positioning of the reflector in relation to the LED light sources is not possible or is only possible in a very complex manner, in accordingly complex systems.

The object of the invention is to specify a method by means of which an exact and simple positioning of a reflector or of a light-shaping member, such as a reflector, a lens, a light guide, an aperture, etc., in relation to one or more light sources is possible.

This object is achieved in accordance with the invention with a method of the type mentioned in the introduction by the following steps:
a) fitting the at least one light source on a carrier plate;
b) measuring the position of the at least one light source on the carrier plate;
c) fitting one or preferably more reference positions on the carrier plate, wherein the position of the at least one reference position is dependent on the position of the at least one light source;
d) referencing, that is to say aligning, the light-shaping member to/with the reference position(s) on the carrier plate; and
e) securing the light-shaping member to the carrier plate or in relation to the carrier plate.

Due to the method according to the invention, the tolerance chain can be significantly reduced, since only tolerances when measuring the position of the light source, tolerances when fitting the reference positions and tolerances of the light-shaping member still occur per se. An exact positioning of the light source(s) and of the light-shaping member relative to one another is thus drastically simplified.

In an alternative embodiment, the following steps are provided in accordance with the invention:
a) fitting one or preferably a number of reference positions on a carrier plate for at least one light source;
b) measuring the position of the at least one reference position one reference position on the carrier plate;
c) fitting the at least one light source on the carrier plate under consideration of the position of the at least one reference position;
d) referencing, i.e. aligning, the light-shaping member to/with the reference positions(s) on the carrier plate; and
e) securing the light-shaping member on the carrier plate or in relation to the carrier plate.

In accordance with a specific embodiment in which an exact positioning of the light-shaping member is particularly important, the at least one light source is an LED light source having one or more light-emitting diodes, and the carrier plate is a printed circuit board for the at least one LED light source.

Here, in step a), the at least one LED light source is preferably soldered to the printed circuit board.

In order to enable a simple and exact positioning, the geometric centre of the at least one light source for example is determined in step b) and the reference positions are arranged on the carrier plate in relation to this geometric centre.

In an even more optimal manner, the light-shaping member can be positioned when, in step b), the lightest region (or the lightest point) of the at least one light source is determined and the reference positions are arranged on the carrier plate in relation to this lightest region.

In accordance with a specific embodiment of the method according to the invention the position of the at least one light source or of the at least one reference position is determined by means of an optical measurement method, preferably using a camera.

Furthermore, it would also be conceivable to perform the determination by means of laser technology, which is more accurate, but also more costly.

In principle, mechanical measurement methods can also be used, however optical measurement methods are preferred.

Furthermore, in accordance with specific embodiments, the one or more reference positions is/are provided in the form of one or more holes, for example slots, and/or in the form of one or more reference edges preferably running in a straight line.

The appropriate reference face/edge/hole that brings the light-shaping member into a clearly defined position is established depending on the application and embodiment of the light-shaping member. For example, a slot is used so that the light-shaping member can no longer rotate, whereas edges for example delimit the movement of the light-shaping member in a certain direction, for example in a direction towards the light source.

By way of example, reference positions can be drilled and/or milled.

The reference positions can be provided in principle in the form of webs, bores, supporting or bearing faces, slots, stops, etc.

In addition, the light-shaping member is preferably secured in relation to the carrier plate by means of at least one securing element, preferably two securing elements.

For stable securing, the light-shaping member in particular is secured by means of the at least one securing element to a heat sink to which the carrier plate is secured.

To this end, in one specific embodiment, the light-shaping member has a securing base, which is secured to the heat sink such that a particularly stable connection is produced.

The carrier plate itself is secured to the heat sink, for example bonded thereto, such that a good heat transfer from the carrier plate to the heat sink is ensured.

Figure 2:
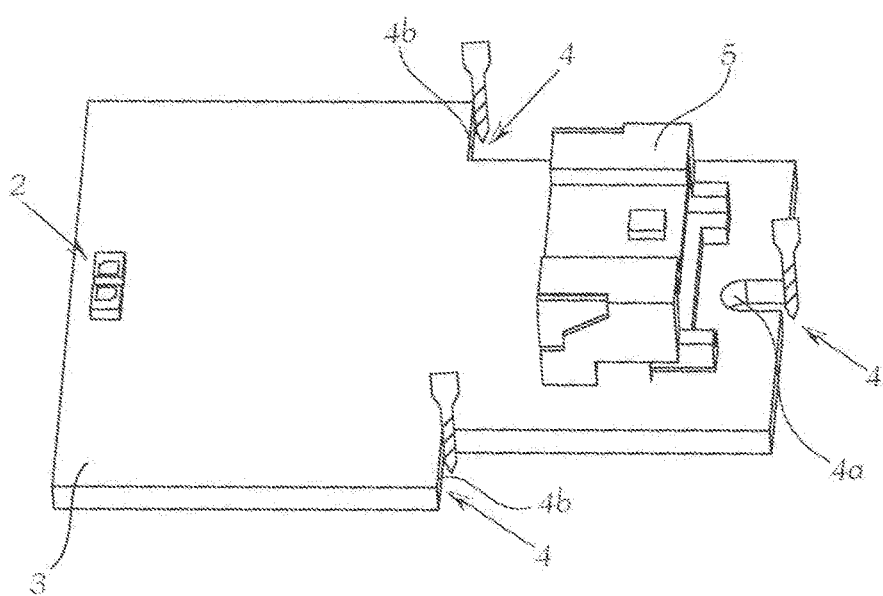
Figure 3:
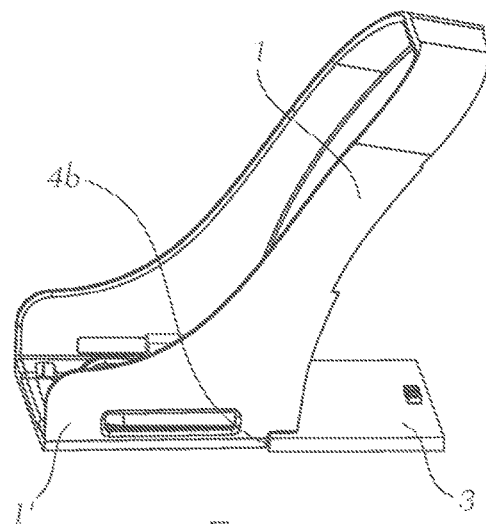
Figure 4:
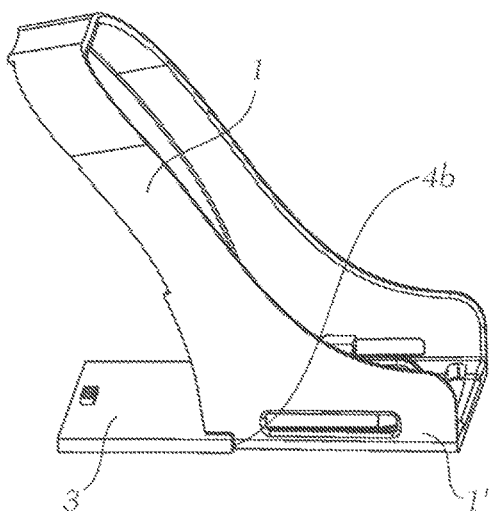
Figure 5:
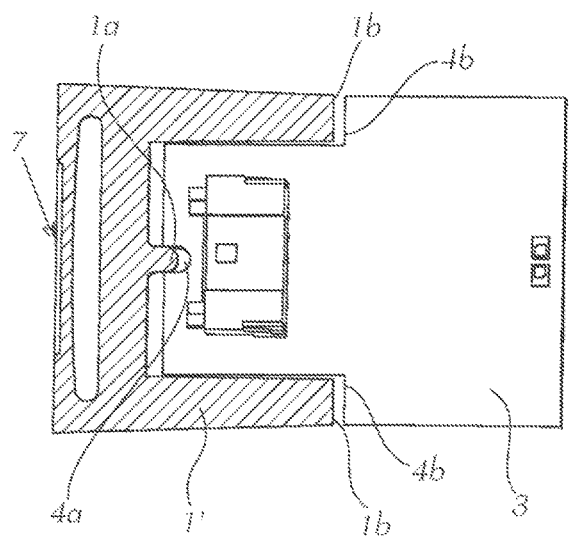
Figure 6:
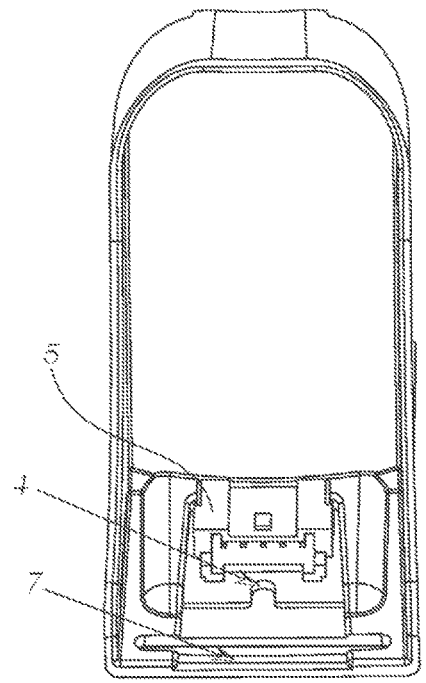
Figure 7:
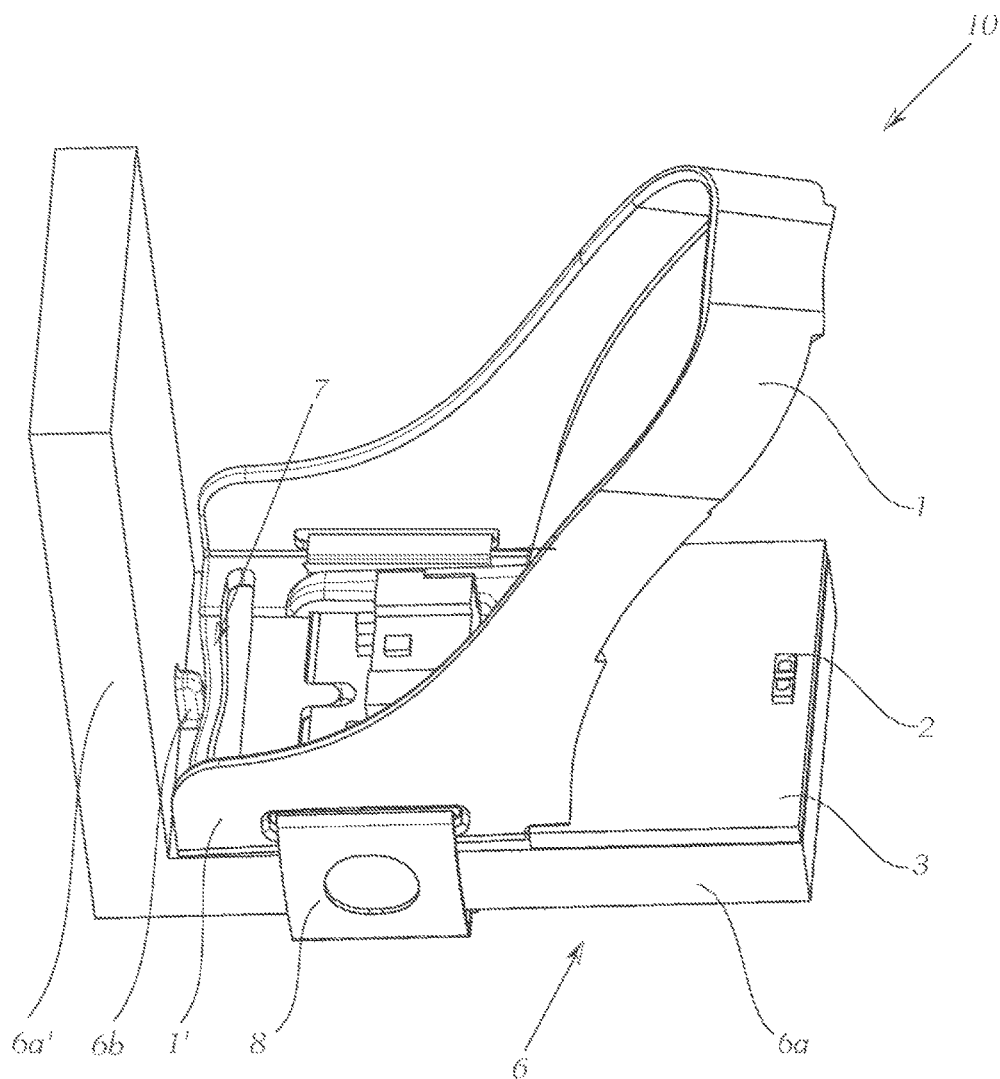

The invention is explained in greater detail hereinafter on the basis of the drawing, in which FIG. 1 shows the basic structure for positioning according to the invention of reference positions on a carrier plate, FIG. 2 shows the carrier plate from FIG. 1 in a detailed view, FIG. 3 shows a reflector positioned on a carrier plate in a side view, FIG. 4 shows the reflector from FIG. 3 in a view from the opposite side, FIG. 5 shows a view of the carrier plate from below with positioned reflector, FIG. 6 shows a view of the carrier plate with fitted reflector obliquely from above, and FIG. 7 shows a view of a reflector secured to a heat sink in relation to the carrier plate.

FIG. 1 shows an arrangement for carrying out a method according to the invention for positioning a light-shaping member, such as a reflector 1, relative to at least one light source 2.

FIG. 1 shows a carrier plate 3, here a printed circuit board (LED print), on which a light source 2 is fitted in a step a).

In the shown variant, the light source 2 is an LED light source, which here has two light-emitting diodes. Accordingly, as already mentioned above, the carrier plate 3 is a printed circuit board for the LED light source 2. Here, the LED light source 2 is preferably soldered to the printed circuit board 3 in step a).

FIG. 1 also shows a camera 200, by means of which the position of the LED light source 2 on the carrier plate 3 is determined in step b).

Here, in step b), the geometric centre of the LED light source 2 is determined for example, or in step b) the definitive lightest region (or the lightest point) of the LED light source 2 is determined.

Here, the LED light source comprises precisely one LED, and the lightest point of this LED thus is decisive for the referencing or positioning of the reference positions.

If the LED light source comprises two or more LEDs, it is thus dependent on the respective application as to whether the relevant lightest point is that produced jointly by all LEDs of the LED light source or whether for example the lightest point is considered to be the lightest point merely of a certain, defined LED (in the case of 3 LEDs, the middle LED for example) of the LED light source. In the latter case, only the measurement or determination of the lightest point of this one, distinguished LED is necessary. A portion of all LEDs of an LED light source can also be considered, and the jointly produced lightest point of said portion can be determined.

Once the LED printed circuit board has been fitted with the LED light source, the lightest point or region decisive for the specific application thus is generally determined by measuring the defined LED, the plurality of defined LEDs or all LEDs.

It is also conceivable for the lightest point or the point that is to be used as a starting point for referencing to be fixedly predefined, for example by the manufacturer of the light-emitting diodes or of the LED light sources.

In a next step c), a plurality of reference positions 4 for a reflector 1 are fitted on the carrier plate 3, wherein the position of the reference positions 4 is dependent on the position of the LED light source 2.

Here, the reference positions are preferably arranged under consideration of the geometric centre of the LED light source 2 or of the lightest region of the LED light source 2.

In the shown example, as can be seen in particular in FIG. 2, the reference positions 4 are constituted by a slot 4a open on one side and by two reference edges or reference planes 4b running in a straight line. The reference positions 4 are produced for example by drilling, milling or in another way, for example laser cutting can also be used.

Furthermore, a plug housing 5 for the electrical contacting of the LED light source 2 is also shown in FIG. 2.

In a next step d), the reflector 1 is referenced to these reference positions 4, i.e. is aligned with and positioned on the carrier plate 3, as is illustrated in FIGS. 3-6 from different views.

Here, in the shown embodiment, the reflector 1 has a securing base 1', which is equipped with the appropriate shaped portions corresponding to the reference positions 4a, 4b, for example en extension 1a, which is arranged in the slot 4a, and also base faces or base planes 1b, which bear against the reference faces 4b of the carrier plate 3. (The at least one reflecting face of the reflector 1 is not illustrated in the figures.)

In FIGS. 3 and 4 the referencing of the reflector and/or of the reflector base 1' to the reference faces 4b via the portions 1b thereof can be clearly seen, whereas FIGS. 5 and 6 show how the reflector 1 or the base 1' is positioned with the extension 1a in the slot 4a.

In this way, the reflector 1 is positioned on the carrier plate 3 in the desired position in relation to the LED light source 1 arranged on the carrier plate 3 and is secured in a further step e) to the carrier plate 3 or in relation to the carrier plate 3.

Due to the reference positions 4a, 4b, the reflector 1 assumes the desired position and, for securing, can be held therein for example by means of a dedicated holding device (not illustrated), until it eventually is ultimately fixed (detachably in some circumstances) in this position, as is described below by way of example on the basis of a specific embodiment.

However, for example, one or more return elements 7, for example in the form of one or more springs (such as compression springs) can also be provided, which hold the reflector or generally the light-shaping member in the reference position thereof until said light-shaping member is fixed.

FIG. 7 in this context shows a light module 10 according to the invention. The return element 7 is arranged between the securing base 1' and a portion 6b of the heat sink 6 and for example can be biased by positioning the reflector 1 in the reference position thereof, such that said return element holds the reflector 1 in this position at least temporarily.

As illustrated, the at least one return element 7 is preferably connected integrally to the reflector 1, in particular to the securing base 1' thereof.

The heat sink 6 specifically has two portions 6a, 6a', which for example are arranged at right angles to one another. The carrier plate 3 is arranged on one of the two portions 6a, for example is bonded thereto. Furthermore, the heat sink 6 has a stop region 6b for the return element 7, which stop region 6b for example is formed in one piece with the two portions 6a, 6a'.

When positioning the reflector 1, the return element 7 rests on the stop region 6b and is pressed together, i.e. the return element 7 is biased between the portion 6b and the securing base 1', such that the securing base 1' is pushed into the reference positions 4a, 4b. In this way, the reflector 1 is held in this position at least temporarily.

In order to secure the reflector, the reflector 1 for example is secured to a heat sink 6 (in the shown example to the portion 6b of the heat sink 6 to which the carrier plate 3 is secured) by means of at least one securing element 8, preferably by means of two fastening elements 8 as shown. This is shown schematically in FIG. 7.

Specifically, the reflector 1 is secured here via the securing base 1' thereof to the heat sink 6, such that said reflector is secured in a stable manner.

The carrier plate 3 itself is secured to the heat sink 6, for example bonded thereto.

The reflector 1 or the securing base 1' thereof preferably has a bearing face, by means of which the base 1' rests on the printed circuit board. In this way, the spacing between the reflector face and the at least one light source can be reliably adjusted.

The fastening elements 8 for example are formed as springs, for example as sheet metal springs, which springs are provided preferably in the form of yoke springs. The springs are preferably clipped onto the heat sink and the securing base in this embodiment and, as shown in FIG. 7, the base 1' additionally also has, for example, slitted openings for fixing the securing elements 8.

For the sake of clarity, the light module 10 is illustrated here with a dedicated heat sink 6, assigned only to the shown light module 10. In practice, however, a heat sink can also be provided for a plurality of light modules, such that a plurality of carrier plates with light source and light-shaping member are arranged on a single heat sink.

The invention has been explained above on the basis of a reflector, however the light-shaping member may also be an optics, for example a lens, a light guide, etc.

The invention claimed is:

1. A method for positioning a reflector or other light-shaping member relative to at least one light source, the method comprising:
   a) fitting the at least one light source on a carrier plate;
   b) measuring the position of the at least one light source on the carrier plate;
   c) fitting at least one reference position on the carrier plate, wherein the position of the at least one reference position is dependent on the position of the at least one light source and the at least one reference position comprises a slot, a hole, a reference edge, or a combination thereof;
   d) aligning the reflector or other light-shaping member with the at least one reference position on the carrier plate; and
   e) securing the reflector or other light-shaping member on the carrier plate or in relation to the carrier plate,
   wherein the reflector or other light-shaping member is secured in relation to the carrier plate by at least one securing element that secures the reflector or other light-shaping member to a heat sink to which the carrier plate is secured, and
   wherein in steps b) and c):
   the geometric centre of the at least one light source is measured and the at least one reference position is fitted on the carrier plate in relation to the geometric centre, or
   the definitive lightest region or the lightest point of the at least one light source is measured and the at least one reference position is fitted on the carrier plate in relation to the definitive lightest region or the lightest point.

2. The method of claim 1, wherein the at least one light source is an LED light source having one or more light-emitting diodes, and the carrier plate is a printed circuit board for the LED light source.

3. The method of claim 2, wherein the LED light source is soldered to the printed circuit board in step a).

4. The method of claim 1, wherein the position of the at least one light source or of the at least one reference position is determined by means of an optical measurement method.

5. The method of claim 4, wherein the optical measurement method comprises using a camera.

6. The method of claim 1, wherein the at least one reference position is drilled and/or milled.

7. The method of claim 1, wherein:
   step c) comprises fitting two or more reference positions on the carrier plate, the reference positions being dependent on the position of the at least one light source, and
   step d) comprises aligning the reflector or other light-shaping member with the two or more reference positions on the carrier plate.

8. The method of claim 1, wherein the at least one reference position comprises two or more reference positions running in a straight line.

* * * * *